United States Patent [19]

Kintis et al.

[11] Patent Number: 5,994,982
[45] Date of Patent: Nov. 30, 1999

[54] MEMS SWITCHED RESONATORS FOR VCO APPLICATIONS

[75] Inventors: Mark Kintis, Manhattan Beach; John J. Berenz, San Pedro, both of Calif.

[73] Assignee: TRW Inc., Redondo Beach, Calif.

[21] Appl. No.: 08/897,120

[22] Filed: Jul. 18, 1997

[51] Int. Cl.⁶ .............................. H01P 7/00; H03B 1/00
[52] U.S. Cl. ...................... 333/235; 331/34; 331/177 R; 331/177 V; 331/179
[58] Field of Search ..................................... 333/174, 175, 333/205, 204, 219, 235, 262; 331/179, 117 R, 117 D, 107 SL, 167, 99, 177 R, 177 V, 46, 34; 334/45, 52, 55, 56, 60, 64, 72, 87

[56] References Cited

U.S. PATENT DOCUMENTS

| | | | |
|---|---|---|---|
| 4,442,415 | 4/1984 | Ashida | 331/179 |
| 4,623,856 | 11/1986 | Bickley et al. | 333/235 X |
| 4,649,354 | 3/1987 | Khanna | 331/179 X |
| 4,692,724 | 9/1987 | Harris | 333/235 X |
| 5,065,121 | 11/1991 | Ghadaksaz | 333/235 |
| 5,168,249 | 12/1992 | Larson | 333/262 X |
| 5,260,862 | 11/1993 | Marsh | 333/174 X |
| 5,565,821 | 10/1996 | Murtojarvi | 331/177 V |
| 5,625,325 | 4/1997 | Rotzoll et al. | 331/17 X |

*Primary Examiner*—Seungsook Ham
*Attorney, Agent, or Firm*—Michael S. Yatsko

[57] ABSTRACT

A switched resonator formed from a series capacitor and a single microstrip transmission line with a plurality of RF switches to connect it to ground along its length. The microstrip transmission line is grounded at one end and the RF switches are used to tune its length. The other end of the microstrip transmission line is connected to the capacitor to form a resonator. The resonant frequency of the resonator is varied by grounding the center conductor through RF switches connected to ground at different points along its length, which effectively varies the electrical length of the transmission line connected to the capacitor thereby forming a switched resonator. The switched resonator is suitable for use with a single VCO to provide relatively wideband tuning of the significantly reduced size due to the use of a single VCO.

8 Claims, 21 Drawing Sheets

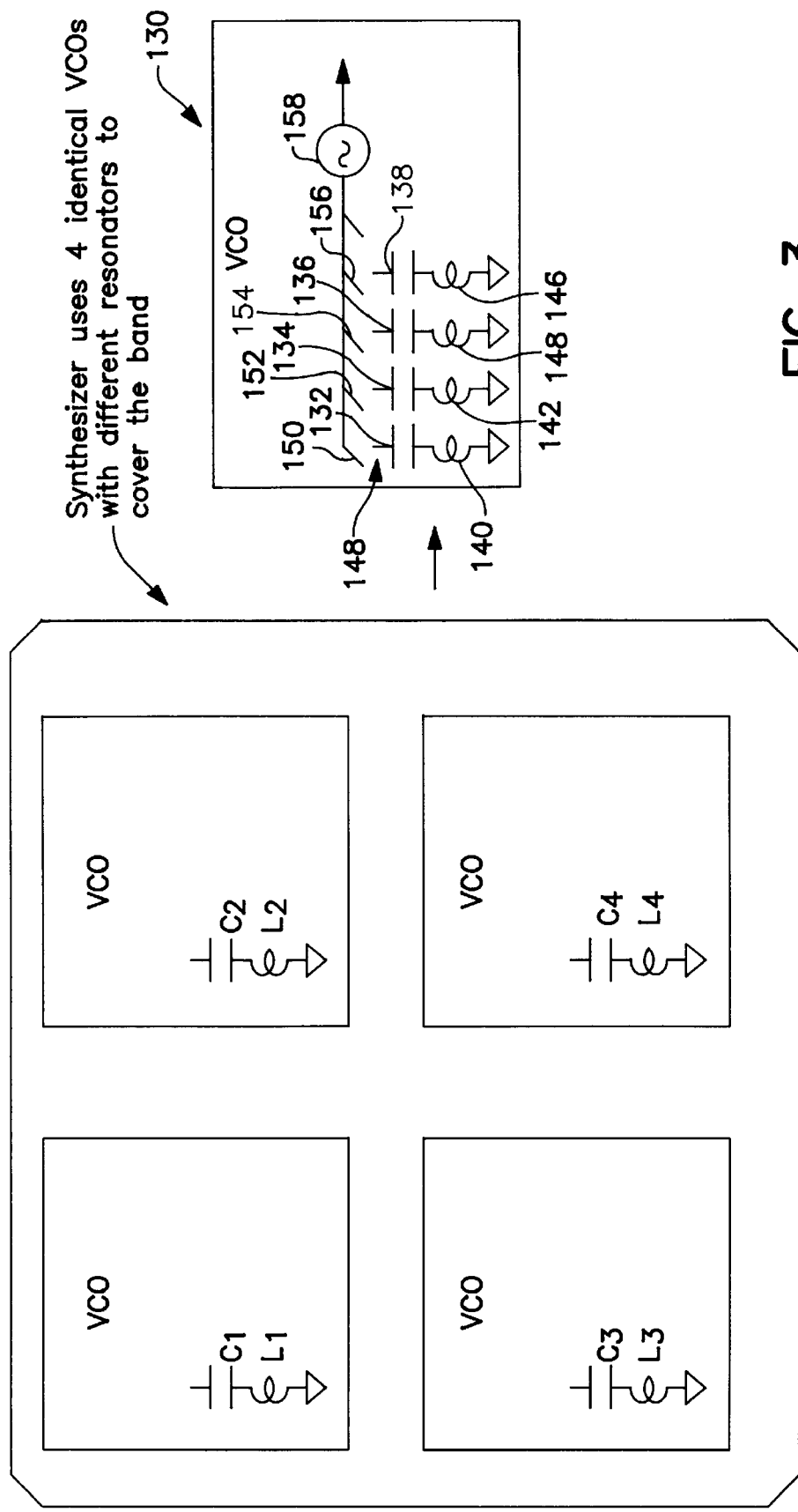

5,994,982

MEMS SWITCHED RESONATORS FOR VCO APPLICATIONS

CROSS REFERENCE TO RELATED APPLICATIONS

This application is related to a co-pending patent application entitled Micro Electro-Mechanical System (MEMS) by J. Berenz, J. McIver and A. Lee, Ser. No. 08/897,075 filed on Jul. 18, 1997.

BACKGROUND OF THE INVENTION

1. Field of the Invention

The present invention relates to a switched resonator and more particularly to a switched resonator formed, for example, from a capacitor and transmission lines configured with a plurality of RF switches to provide different inductances, the transmission lines being electrically connected to the capacitor forming a resonator with switchable resonant frequencies.

2. Description of the Prior Art

Heterojunction bipolar transistor (HBT) device technology is known for low phase noise VCO applications due to the 1/f noise of such devices relative to MESFETs at microwave to millimeter-wave cut off frequencies. Known HBT VCO devices have superior phase noise performance compared to MESFET VCOs and comparable performance to silicon based VCO's at the C-Ku-band frequencies. However, above such frequencies, HBT technology is preferred for low phase noise VCO applications because of the superior frequency operating capability of HBT based devices compared to the silicon based BJTs and lower device phase noise compared to MESFETs and HEMT technologies. However, for relatively high performance frequency synthesizer applications, phase noise performance over a relatively wide tuning bandwidth provides relatively unacceptable performance. In order to satisfy the low phase noise and frequency tuning bandwidth requirements, often several VCO's are used which cover several narrower overlapping tuning bandwidths forming a switched band synthesizer. The narrower VCO tuning bandwidths provide a higher Q in order to achieve lower phase noise.

A schematic diagram of a known frequency synthesizer is Ad illustrated in FIG. 1 and generally identified with the reference number 100. The frequency synthesizer 100 is a four-band synthesizer and includes 4 voltage controlled oscillators (VCO) 102, 104, 106 and 108. Each of the VCO's 102, 104, 106 and 108 is coupled to a buffer amp 110, 112, 114 and 116, respectively, whose outputs, in turn, are coupled to a switch 118, for example, a single pole, four-throw switch. A plurality of off-chip resonators 120, 122, 124 and 126 are coupled to the inputs of the VCO's 102, 104, 106 and 108, respectively. In order to provide different frequency bands, each of the resonators 102, 120, 122, 124 and 126 are configured to provide different resonator frequencies.

A Quelch signal is used to select among the VCO's 102, 104, 106 and 108. As mentioned above, the VCO's 102, 104, 106 and 108 are connected to the switch 118 by way of the buffer amps 110, 112, 114 and 116 respectively. The Quelch signal is used to select a frequency band and connect the output of the VCO 102, 104, 106 and 108 for the selected bands at the switch 118 to an output amp 128.

Unfortunately, there are several problems with the configuration of the frequency synthesizer as illustrated in FIG. 1. For example, the overall size of circuitry as illustrated in FIG. 1 is relatively large. In particular, the circuit illustrated in FIG. 1 is typically formed as a microwave monolithic integrated circuit (MMIC) with a chip size of for example, 25,000 μm by 25,000 μm. The relatively large size of the frequency synthesizer MMIC is primarily due to the fact that a separate VCO is required for each frequency band of the synthesizer. Moreover, with such a configuration, since the switching is primarily performed by way of the switch 118 at the output of the VCO's 102, 104, 106 and 108, the settling time of such a configuration is less than optimal in certain applications.

SUMMARY OF THE INVENTION

It is an object of the present invention to solve various problems in the prior art.

It is yet another object of the present invention to provide a frequency synthesizer with reduced size relative to known frequency synthesizers.

It is yet a further object of the present invention to provide a switched resonator for use with a single voltage controlled oscillator (VCO) which allows selective switching of the resonant frequency.

Briefly, the present invention relates to a switched resonator formed from a series capacitor and a single microstrip transmission line with a plurality of RF switches to connect it to ground along its length. The microstrip transmission line is grounded at one end and the RF switches are used to tune its length. The other end of the microstrip transmission line is connected to the capacitor to form the resonator. The resonant frequency of the resonator is varied by grounding the center conductor through RF switches connected at different points along its length, which effectively varies the electrical length of the transmission line connected to the capacitor thereby forming a switched resonator. The switched resonator is suitable for use with a single VCO to provide relatively wideband tuning but at reduced size relative to known frequency synthesizers due to the use of a single VCO.

DESCRIPTION OF THE DRAWINGS

These and other objects of the present invention will be readily understood with reference to the following specification and attached drawing wherein:

FIG. 2 is a block diagram of the frequency synthesizer illustrated in FIG. 1.

FIG. 3 is a block diagram illustrating the switchable resonator in accordance with the present invention compared to known frequency synthesizer which utilizes separate VCO's for each frequency band.

3

Figure 7:
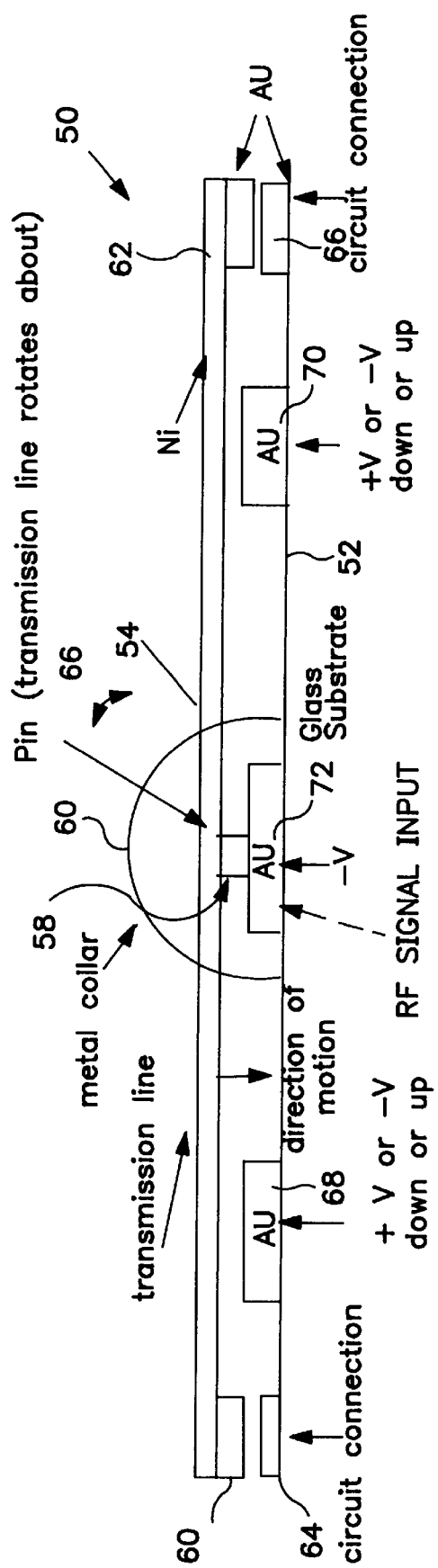
FIG. 7 is an elevational view of an RF switch for use with the present invention.
Figure 8A:
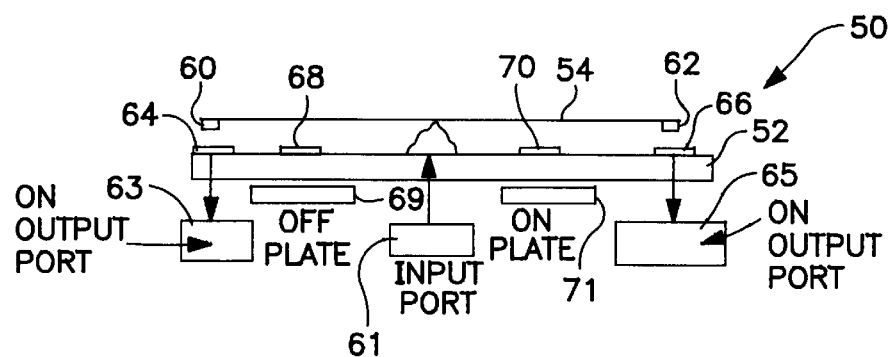

FIG. 8a is similar to FIG. 7 further illustrating field plates.

Figure 8B:
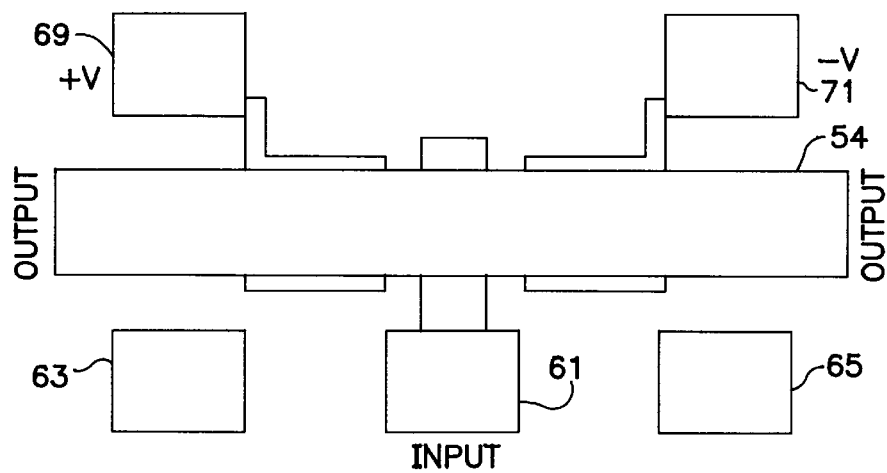

FIG. 8b is a plan view of the RF switch illustrated in FIGS. 7 and 8a.

Figure 9:
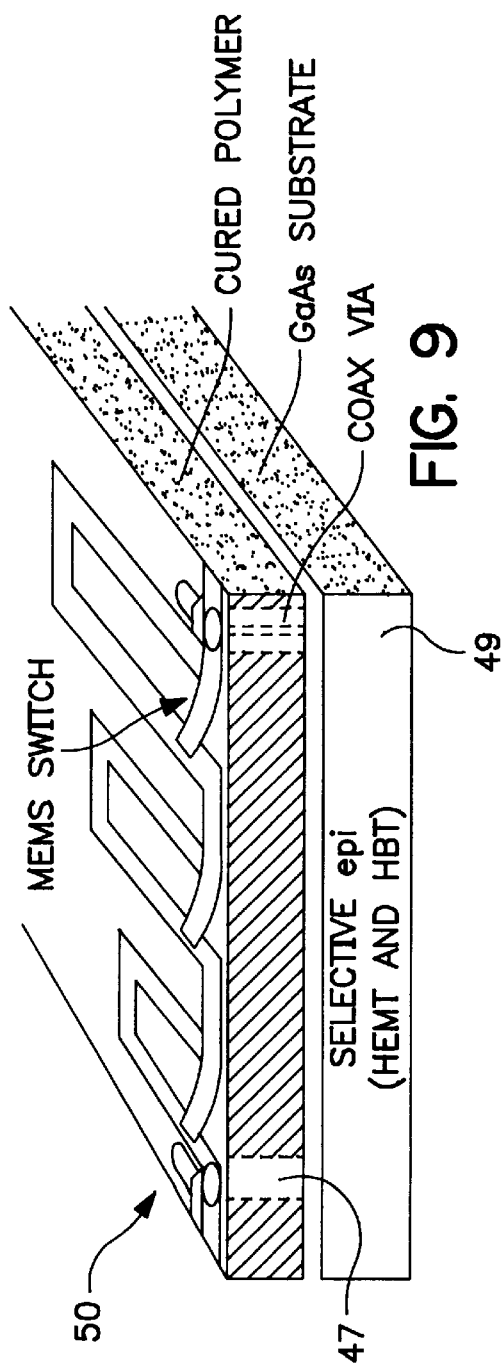

FIG. 9 is a prospective view illustrating an RF switch for use with the present invention fabricated on an MMIC.

Figure 5:
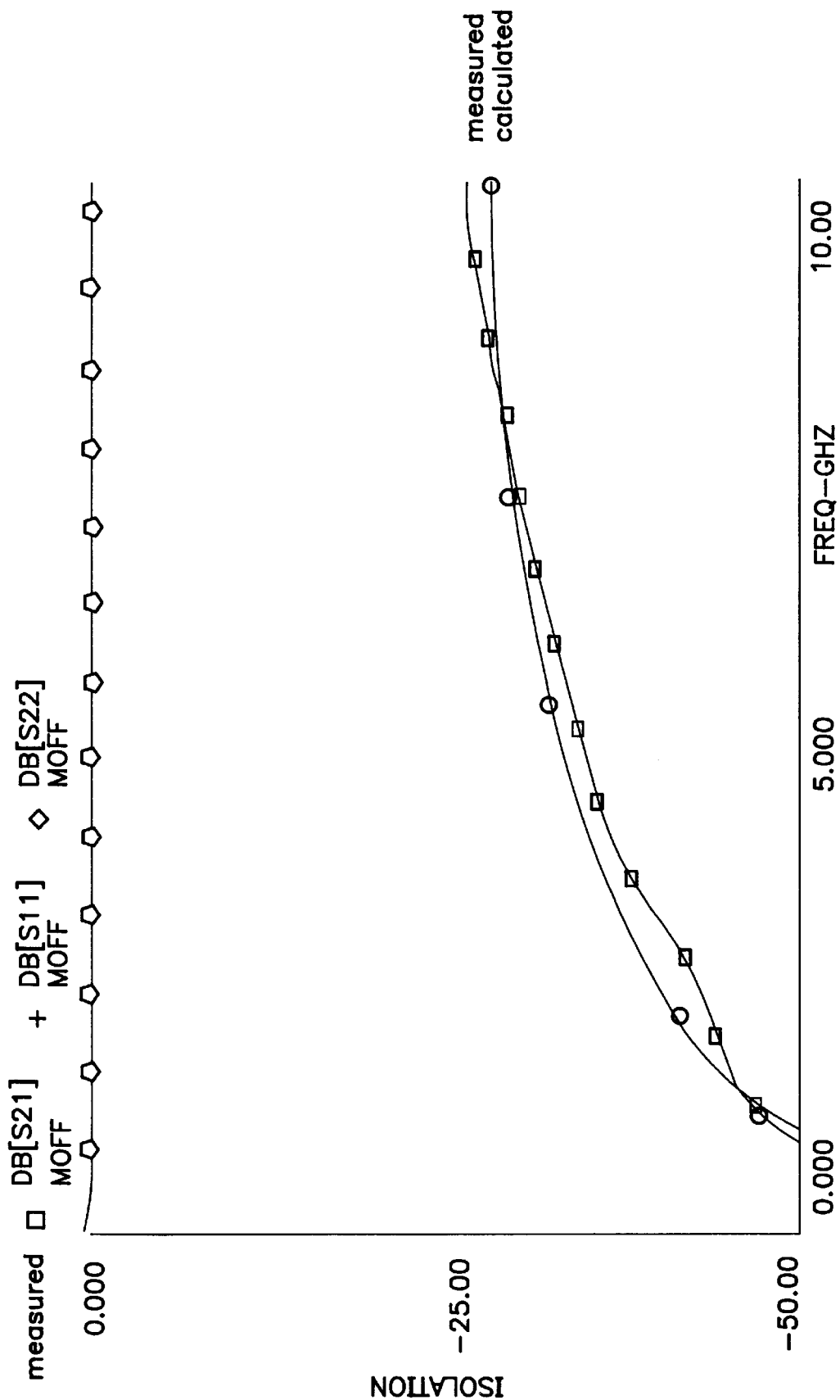
FIG. 5 is a graphical illustration of the insertion loss as a function of frequency or the switched resonator in accordance with the present invention in a switch off condition.
Figure 6:
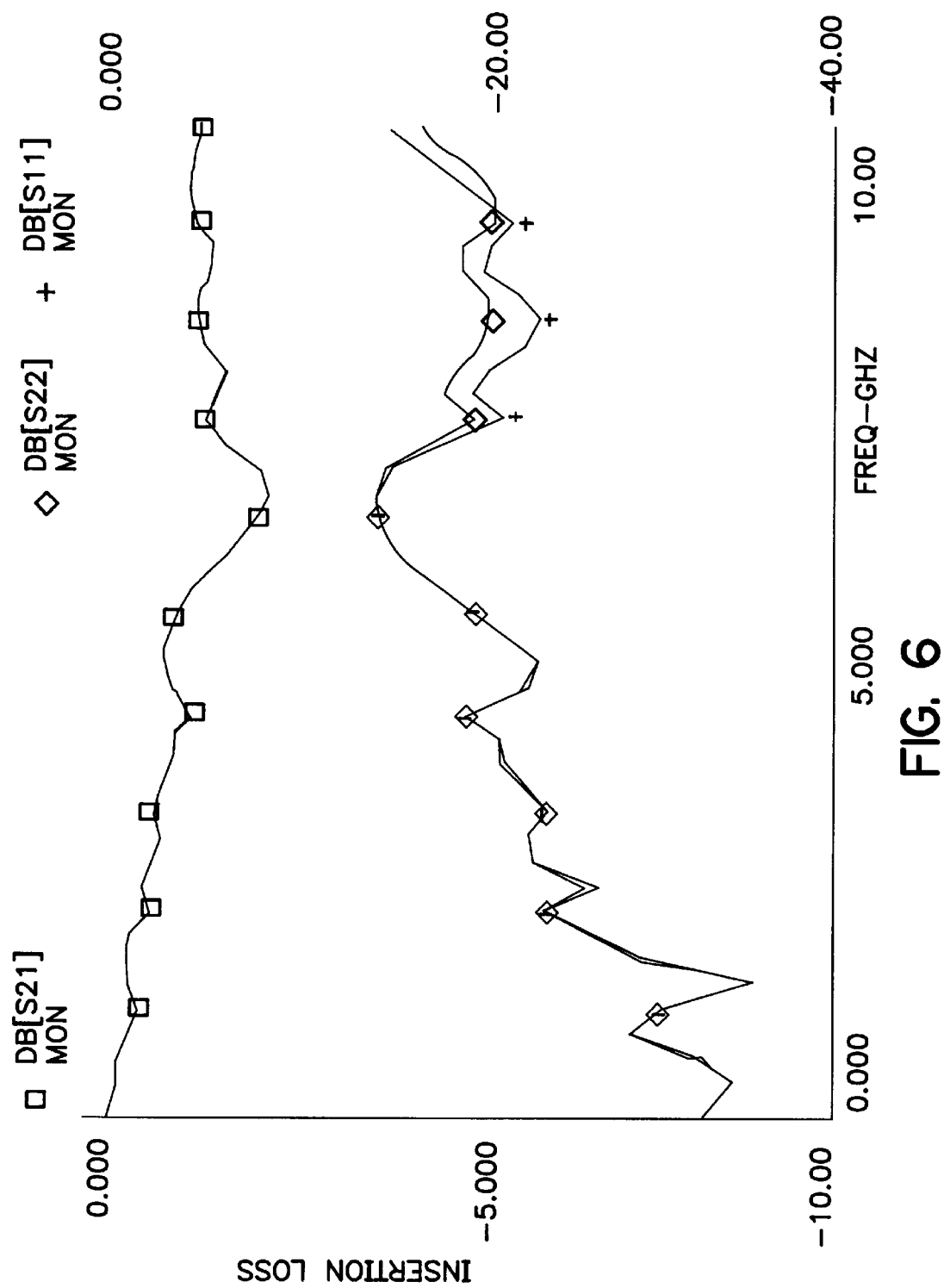
FIG. 6 is a graphical illustration of the insertion loss as a function of frequency in GHz for the switch resonator in accordance with the present invention in a switch on condition.
Figure 10A:
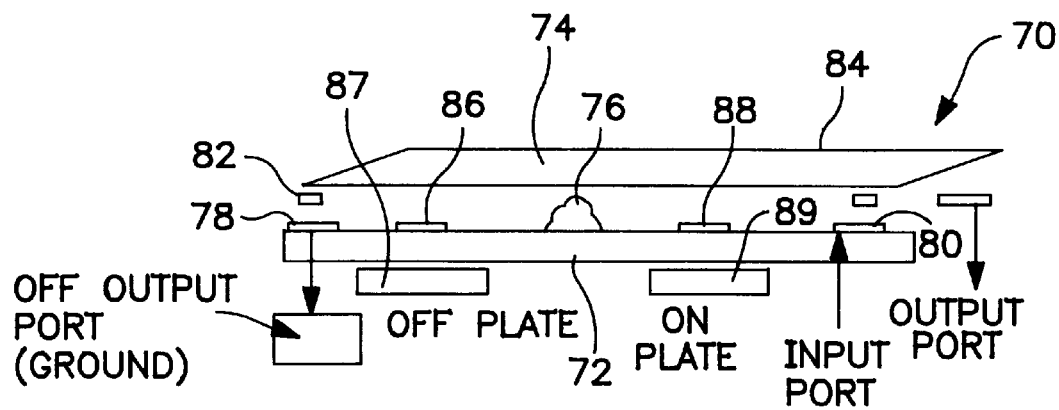

FIG. 10a is an elevational view of an alternate embodiment of the RF switch illustrated in FIG. 5.

Figure 10B:
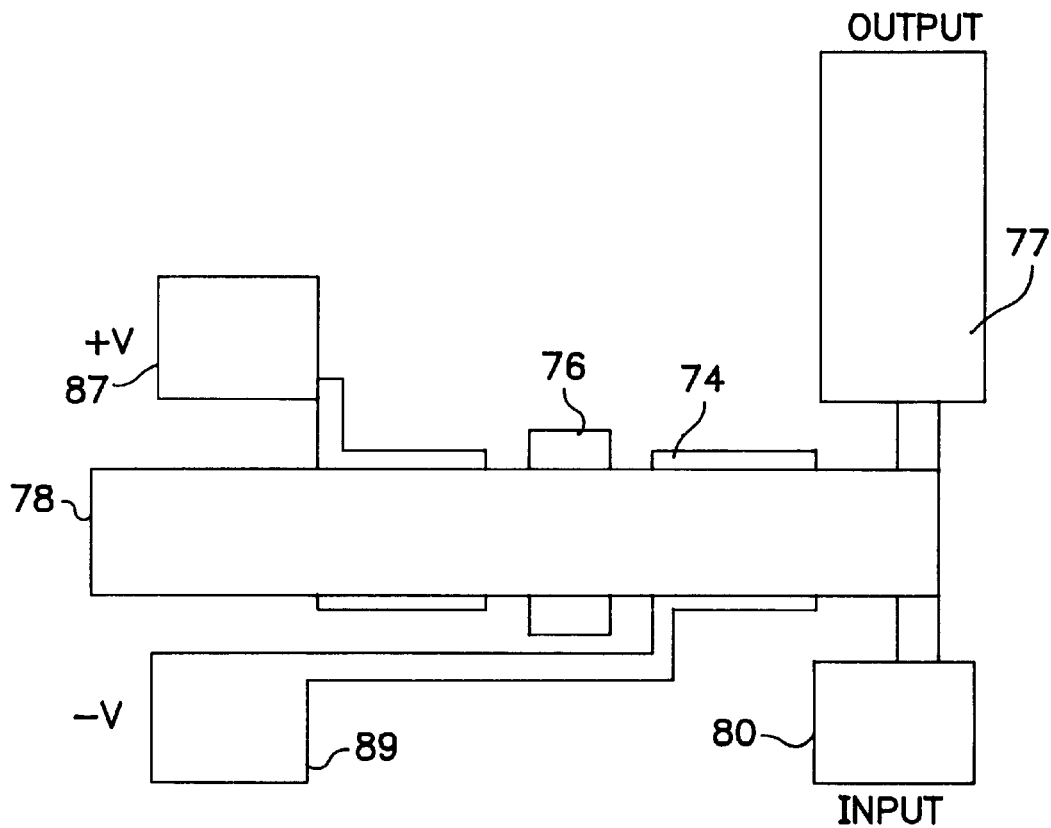

FIG. 10b is a plan view of the RF switch illustrated in FIG. 10a.

Figure 11:
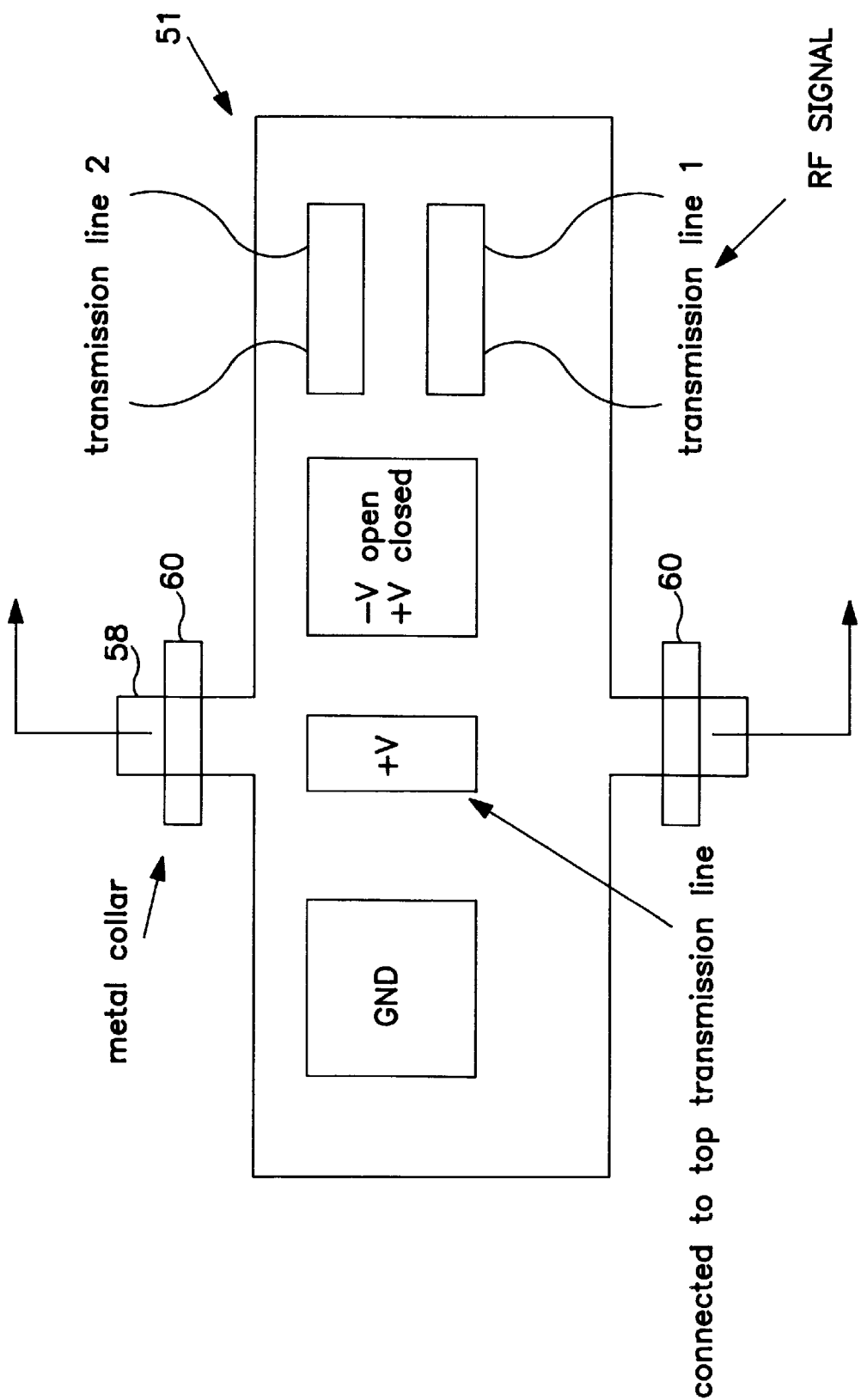

FIG. 11 is a plan view of another alternate embodiment of the RF switch illustrated in FIG. 5.

Figure 12:
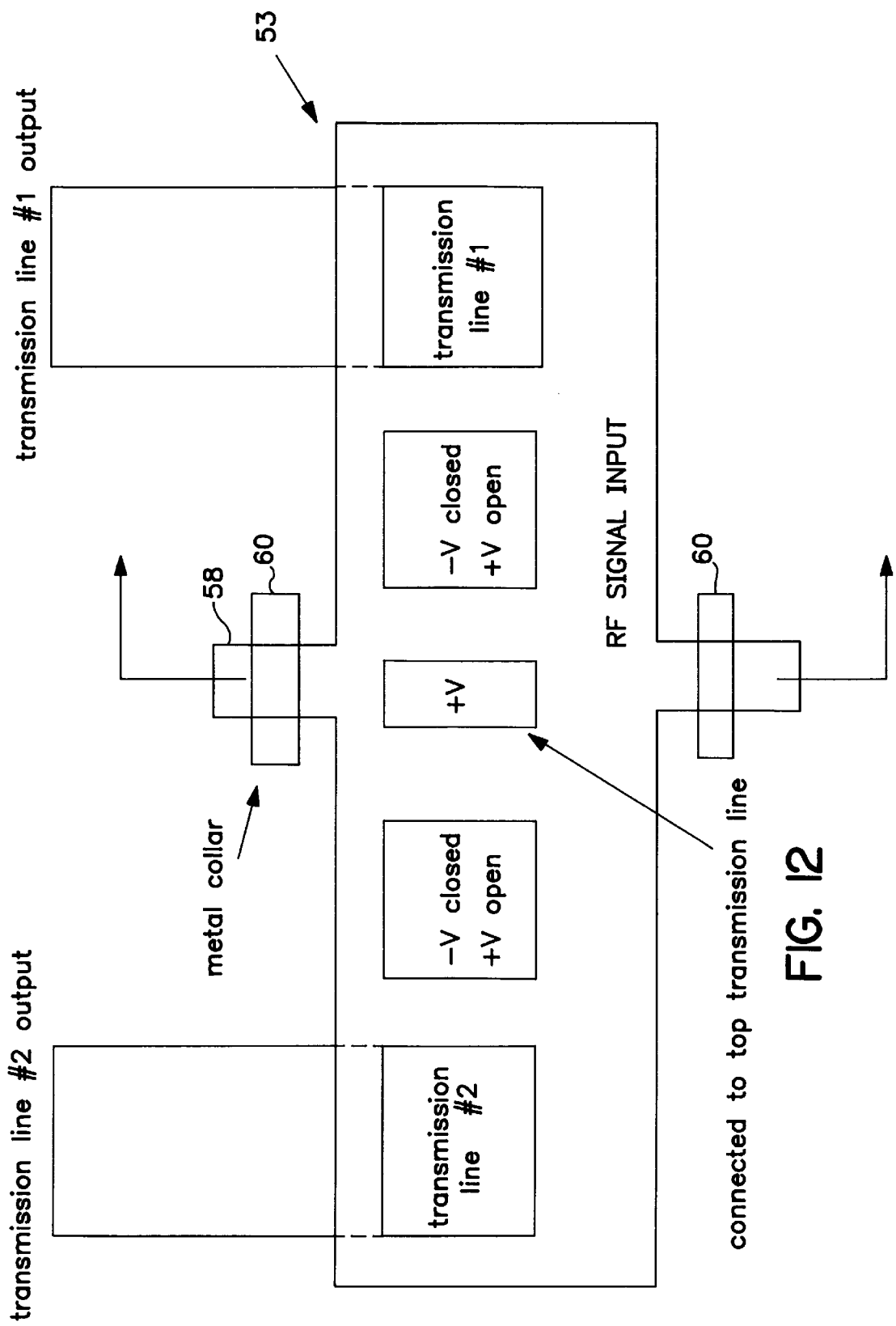

FIG. 12 is a plan view of another alternate embodiment of the RF switch illustrated in FIG. 5.

Figure 13:
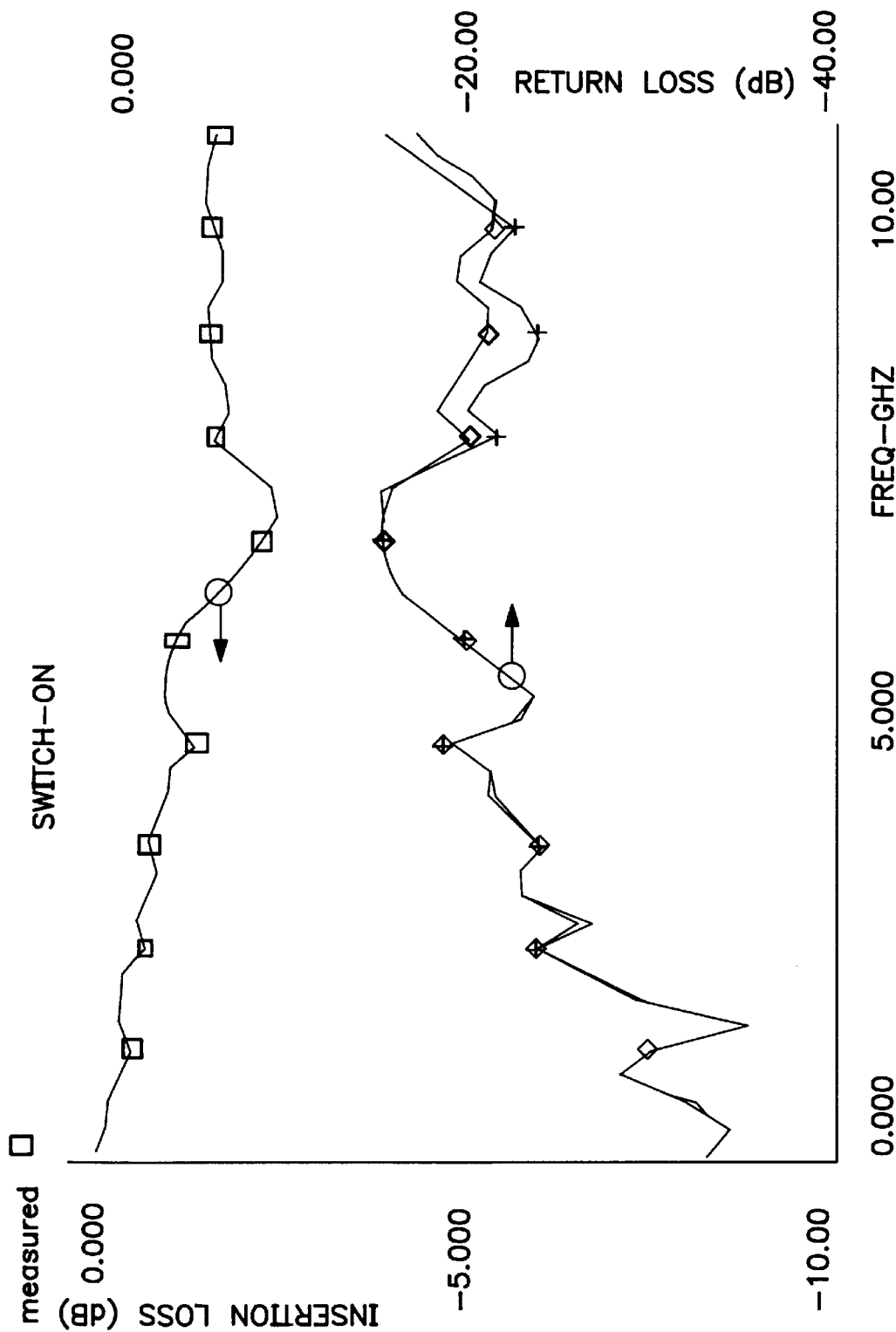

FIG. 13 is a graphical illustration of the insertion and return loss in dB as a function of frequency in GHz of an exemplary switch in an ON position.

Figure 14:
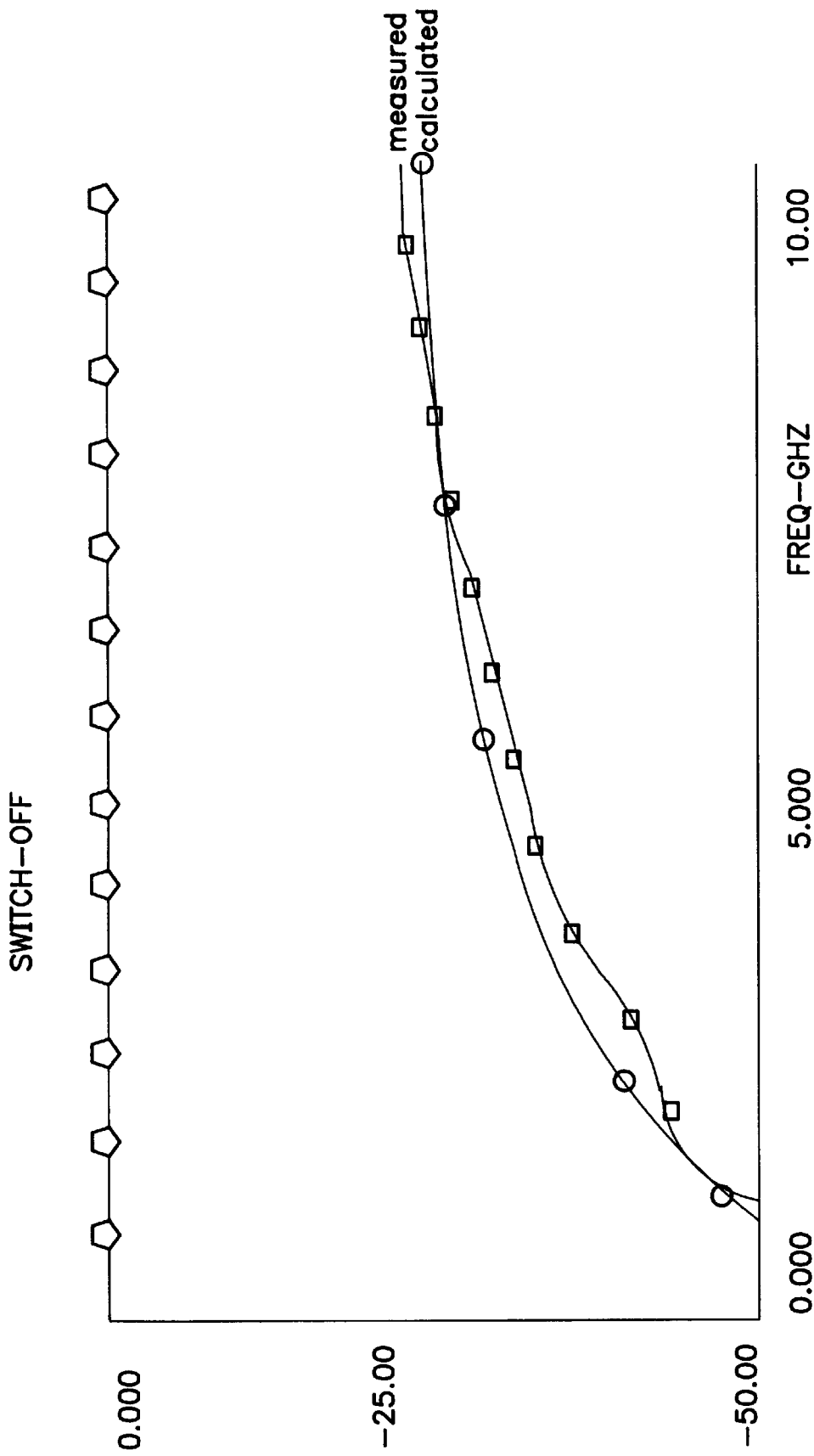

FIG. 14 is a graphical illustration of the isolation in dB as a function of frequency in GHz of an exemplary switch in an OFF position.

Figure 15A:
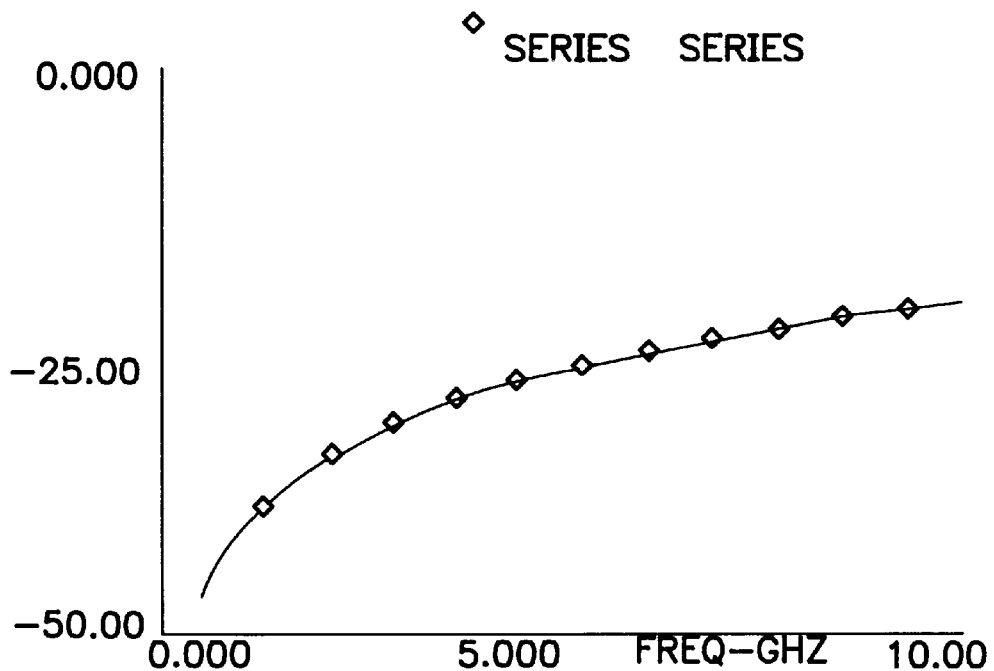
Figure 15B:
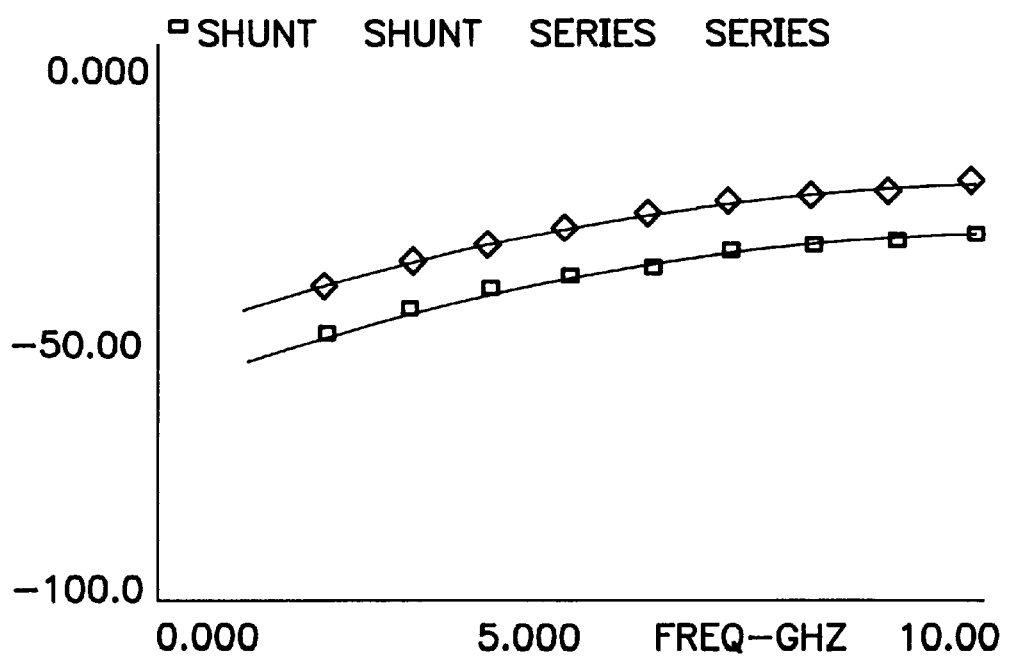

FIGS. 15a–15b are graphical illustrations of the isolation of the switches illustrated in FIGS. 8 and 10, respectively.

Figure 16:
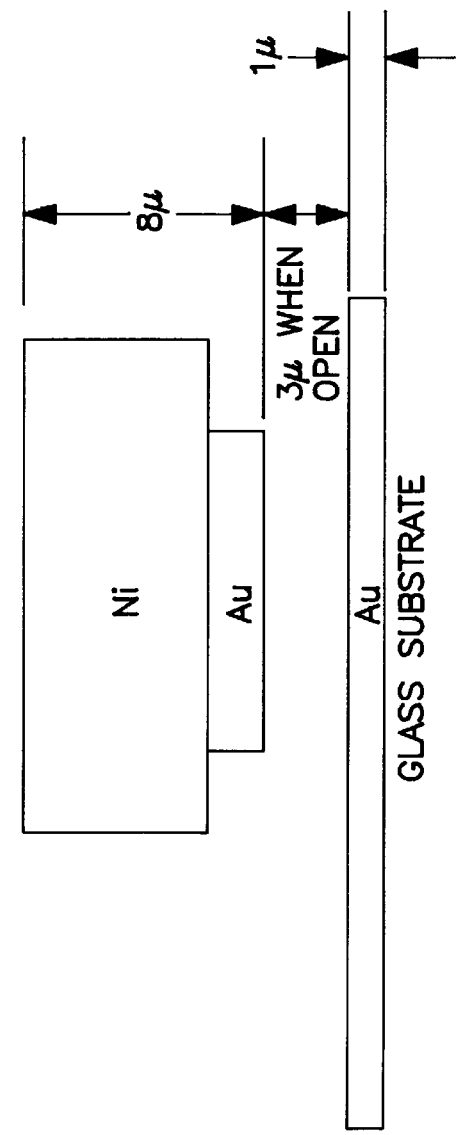

FIG. 16 is an elevational view of an exemplary contact configuration for an RF switch for use with the present invention.

FIGS. 17–20 are drawings illustrating the step by step fabrication process for the RF switch used with the present invention.

DETAILED DESCRIPTION

Switchable Resonator

A switched resonator in accordance with the present invention is generally illustrated in FIG. 3 and identified with the reference numeral 130. As shown, the resonator is formed from a plurality of chip capacitors 132, 134, 136 and 138, coupled in series with a microstrip transmission line, modeled as lumped inductances 140, 142, 144 and 146 respectively. One end of each of the microstrip transmission lines 140, 142, 144 and 146 is grounded to form an inductance for setting the center frequencies of each of the switchable resonators.

If the chip capacitors 132, 134, 136 and 138 are selected to be, for example, 1pF, a microstrip transmission line 140, 142, 144 and 146 having a width 50 microns and a length of 0.6 inches, a resonant frequency of the oscillator would be 2 GHz. By varying the length of the microstrip transmission lines 140, 142, 144 and 146, for example, by 0.25 inches, the center frequency of the resonators can be varied from about 1.5 to 2.5 GHz.

As shown in FIG. 3, each of the resonators formed by the series LC circuits, is connected to an RF switch generally identified with the reference numeral 148 having switch contacts 150, 152, 154 and 156. By selectively closing the switch contacts 150, 152, 154 and 156 such that only one switch contact 150, 152, 154 and 156 is closed at a time, different resonator frequencies are selected by effectively tuning the electrical length of the microstrip transmission lines, 140, 142, 144 and 146 to provide different resonant frequencies to a single voltage control oscillator (VCO) 158. In order to provide the switching of the series LC resonators without degrading the Q of the resonator and the low phase noise of the VCO 158, the RF switches 148 are preferably metallic micro electromechanical switches (MEMS) as described in (commonly owned, U.S. patent application Ser. No. 08/897,015 filed on Jul. 18, 1997 and described in detail below.

Figure 4:
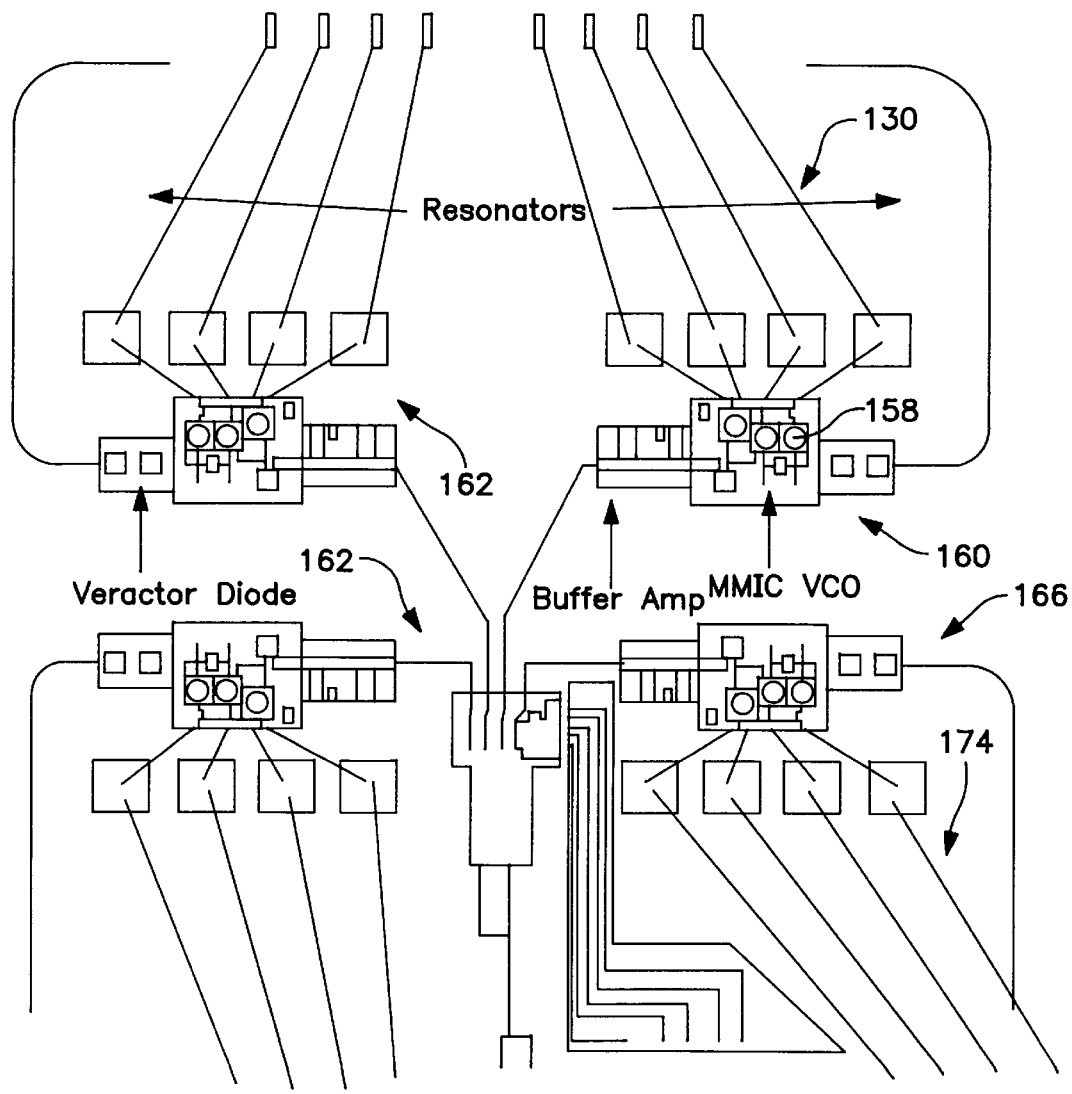
FIG. 4 is a layout diagram illustrating the relative size of a 16 band frequency synthesizer formed in accordance with the present invention.

As shown in FIGS. 3 and 4, the switchable resonator 130 in accordance with the present invention provides for relatively smaller and thus, a lower cost frequency synthesizer since the switchable resonator 130 utilizes a plurality of LC connected resonators connected to a single VCO 158 while known frequency synthesizers utilize a plurality of LC resonators with each resonator 120, 122, 124 and 126 connected to an identical VCO, 102, 104, 106 and 108.

Figure 1:
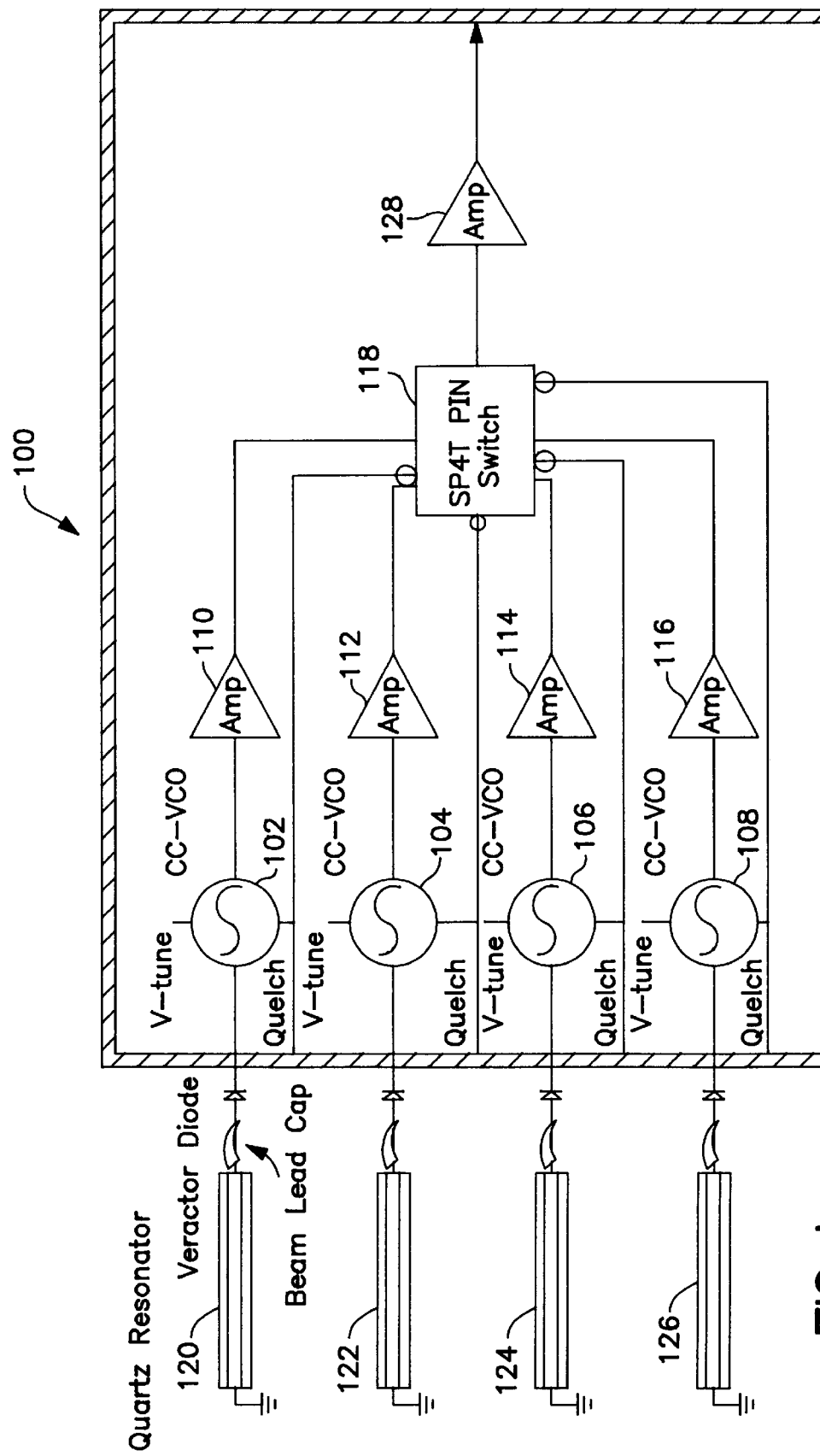
FIG. 1 is a schematic diagram of a known frequency synthesizer which utilizes a plurality of resonators having different resonating frequencies, individually connected to voltage control oscillators.

FIG. 4 illustrates the physical size difference between the switchable resonator 130 and the conventional frequency synthesizer 100 illustrated in FIG. 1. As shown in FIG. 4, four switchable resonator circuits 160, 162, 164 and 166 are shown. Each switchable resonator circuit 160, 162, 164 and 166 includes a switchable resonator circuit 130 as illustrated in FIG. 3, connected to a single VCO 158. As shown, each switchable resonator 130, similar to the switchable resonator discussed above and illustrated FIG. 3, is provided with four series connected LC circuits to provide a total of four for switchable resonators 160, 162, 164 and 166 which, in turn, provide 16 different resonant frequencies forming a 16 band frequency synthesizer. The total chip size for the 16 band frequency synthesizer illustrated in FIG. 4 is 25,000 $\mu$m by 25,000 $\mu$m. As discussed above, in connection with FIG. 1 the four-band frequency synthesizer 100 required about the same size; namely 25,000 $\mu$m by 25,000 $\mu$m. As such, the 4 band switchable resonator 130 is about ¼ the size of the 4 band switchable resonator 100.

RF SWITCH

One embodiment of the RF switch for use with the present invention is illustrated in FIGS. 7, 8a and 8b and generally identified with the reference numeral 50. The switch 50 is adapted to be formed on a substrate 52. In applications where the switch 50 is to be integrated with a microwave monolithic integrated circuit (MMIC), such as HEMT distributed amplifiers and HBT TTL drive circuits, the substrate 52 is formed from a polymer, such as polyamide. The polymer is formed as a layer directly on top of the MMIC to protect the MMIC during the fabrication process of the RF switch. The low dielectric constant of the polyamide (i.e. $\in=2$), for example, provides for a relatively low loss substrate for the RF transmission line. As best shown in FIG. 9, interconnections between the switch 50 and the MMIC 49 may be provided by coaxial via holes 47, which allow transition from one level to another while preserving RF impedance and providing high insulation.

An important aspect of the switch 50 relates to the fact that the beam 54 is rigid and is adapted to rotate about a pin 58. The pin 58 pivotally mounted relative to the substrate 52, for example, by metal collars 60 forming a teeter-totter configuration. By eliminating the bending or torsional flexing of the beam 54, fatigue of the beam is reduced thus, improving the overall reliability of the switch as well as the switch life.

Various configurations of the RF switch are possible. For example, FIG. 8 illustrates a single pole double throw switch shown. The single pole double throw switch 50 is formed with metal contacts 60 and 62, for example, gold Au, formed on the side of the beam 54 facing the substrate 52. These contacts 60 and 62 are adapted to mate with corresponding contacts 64 and 66, respectively, formed on the substrate 52.

The RF switch 50 is adapted to be actuated by electrostatic forces. In particular, a pair of electrical contacts 68, 70 may be formed on the substrate 52. The making and breaking of these contacts 68 and 70 is under the control of electrostatic forces generated as a result of appropriate DC voltages being applied to a corresponding field plates 69 and 71 (FIG. 8a). In particular, the combination of the field plates 69 and 71 with the contacts 68 and 71 form parallel plate capacitors. Thus, application of DC potential to the field plates 69 and 71 will result in electrostatic attraction and repulsion forces between the contacts 68 and 70 and the metal beam 54. The direction of rotation of the beam 54 will be dependent upon the polarity of the DC voltage applied to the field plates 69 and 71. For the single pole double throw switch 50, a contact 72 may be formed on the substrate 52, which, in turn, is in electrical contact with the pin 58 and the beam 54, which are formed from electrical conductive materials (i.e. nickel). The contact 72 may be used as an RF input port 61 (FIG. 8a), while the contact pairs 60, 64 and 62, 66 are used as RF output ports 63 and 65, respectively. In particular, when the contact 62 is in electrical contact with the electrical contact 66, the RF input signal applied to the contact 72 is directed out of the electrical contacts 62 and 66. Alternatively, when the contact 60 is in electrical contact with the contact 64, the RF input signal is directed out of the contacts 60 and 64.

In order to reduce the insertion losses as well as improve the sensitivity of the switch, the beam 54 may be formed from all metal. In particular, the beam 54 may be formed from nickel Ni. Not only does an all metal beam 54 reduce insertion losses relative to known $SiO_2$ or composite silicon metal beams, such a configuration also improves the third order intercept point for providing increased dynamic range.

In the switch configuration illustrated in FIGS. 7, 8a and 8b, the pin 58 forms an RF input port. In FIGS. 10a and 10b, an alternate configuration is shown in which the RF switch, generally identified with the reference numeral 70, includes a substrate 72, a beam 74 and a pin 76. In this embodiment, electrical contacts 78 and 80 are formed on each end of the substrate 72 and adapted to mate with corresponding contacts 82 and 84, respectively, formed on opposing ends of the beam 74. In the latter configuration, the contact 80, formed on one end of the substrate 76, forms an RF input port, while a contact 77 electrically coupled to the beam 74 forms an RF output port.

Electrostatic forces are used to rotate the beam 74 as discussed above. In particular, the contact 78 forms an off output port and is connected to ground. A pair of contacts 86 and 88 formed on the substrate 72 cooperate with a pair of field plates 87 and 89 forming parallel plate capacitors as discussed above. In particular, when the beam 74 pivots in a counter-clockwise direction, the beam 74 is grounded in order to force the electrostatic potential of the beam 74 to be zero. Otherwise unknown electrostatic forces exerted by the switch plates could cause the switch behavior to be erratic. Alternatively, when the switch 70 rotates in a clockwise direction, the beam 74 is ungrounded and the RF input port is directly connected to the beam 74 in which case contact 84 forms an output contact.

Operation of the switches 50 and 70 depend on the electrostatic forces between the beams 54 and 74 and the field plates. The force between the field plates and the beams is a function of the charge Q and the electric field E. One detent plate is maintained at the same potential as the beam and hence the force is zero. The other field plate is provided with a potential difference relative to the beam 74 with a charge which is provided by equation 1:

$$Q = C \cdot V = \epsilon_0 \frac{wl}{t} V \qquad (1)$$

where W is the width of the beam 1 is length of the beam, t is the contact separation and V is the voltage. The electrostatic force is given by equation 2:

$$E = V/t \qquad (2)$$

Since the electrostatic force is the product of the charge Q and the electrostatic field E, the force is provided by equation 3:

$$F = Q \cdot E = \epsilon_0 \frac{wl}{t^2} V^2 \qquad (3)$$

By balancing the structure, electrostatic force is not opposed by any static or acceleration induced counterforces. Thus, when voltage is applied to one plate, the structure tips in that direction closing the contact on the end closest to the active plate and opening the contact on the other end.

The time required for the switch to move from one position to the other is determined by the electrostatic force, the mass of the beam and the distance to be moved. Assuming that the motion of the beam is linear and the electrostatic forces are constant, even though the beam rotates about a pivot that is only about 0.006 radians and the electrostatic force varies by a factor about 2 between starting motion and full closure with a constant voltage, such an analysis provides for bounding of the switching delay by simply allowing the switching delay to be computed as if the weakest electrostatic force was applied for the full time and adding the rise time for the switching voltage. Actual switching time will be less.

The switching delay for the exemplary configuration illustrated in FIG. 13, is given by equation 4:

$$\sqrt{2mxF} \text{ where } m = dLwa, \qquad (4)$$

X is the distance that the beam must move (i.e. three microns), d is the density of the beam (i.e. 8.9 $Kg/m^3$), 1 is the length of the beam (i.e. 900 microns), w is the width of the beam (i.e. 150 microns), a is the thickness of the beam (i.e. 8 microns).

These exemplary vales yield a mass of the beam of 9.6×$-^9$Kg. Selecting t as 4.5 microns and 1 as 200 microns with V at 10 volts, produces an electrostatic force between the beam and the plate as $1.3×10^{-6}$ newtons, which yield a switching time of less than 200 microseconds.

For cases where higher switching speeds are required, the electrostatic force can be increased about 10 times by increasing the voltage applied to the plates from 10 to 35 volts. A factor of 3 reduction in mass is also contemplated in the mechanical design by eliminating inactive areas of the beam. The nickel thickness of the beam can also be reduced in order to optimize the switching speed. It is also contemplated that the vertical spacing could be reduced by a factor of 2 thus, increasing the electrostatic force by a factor of 4, thus decreasing the distance traveled by a factor of 2 yielding a switching time of about 2 microseconds.

The frequency response of the switch (i.e. RF operating frequency) is a function of the physical dimensions of the switch. In general, the smaller the size of the switch, the higher the frequency at which the switch can be operated due to the associated parasitics. The switch in accordance with the present invention is adapted to have minimum dimensions of approximately 10×50 microns; about 10 times small than known RF switches with an RF operating frequency of about 40 GHz.

For the switch, illustrated in FIGS. 7, 8a and 8b the insertion loss, return loss, and isolation up to 10 GHz is illustrated in FIGS. 13–14. These figures show that the switch 50 exhibits relatively low insertion loss and a relatively high return loss at about 2 GHz but an isolation of about 35 db. In order to improve the isolation, two switches can be connected in series provide isolation up to 70 db.

The isolation of the two switches 50 and 70 is compared in FIGS. 15a and 15b, respectively. Since the switch 70 is configured as a shorting bar switch with one end of the beam used to short the input of the output transmission line; by designing the gap spacing and providing for adequate width of the transmission lines, the switch 70 can provide 50 db isolation at 2 GHz as shown in FIG. 15b while two switches in series can provide up to 100 dB isolation.

Alternate configurations of the switches 50 and 70, are illustrated in FIGS. 11 and 12. In the embodiment illustrated in FIG. 11, a switch 51 is used to connect a through transmission line, while a switch 53 is used to connect two parallel spaced aport transmission lines.

The switch 51 has two switch states; open and closed. In an open state the two transmission lines are disconnected while in a closed state the two transmission lines are connected.

The switch 53 has three switch states; all open, one closed or both closed. In this embodiment, the beam connecting the two transmission lines is able to move in a linear vertical direction as well as pivot about the pin in order to connect or disconnect one or both of the transmission lines from the RF signal, coupled to the beam.

FIGS. 17–20 illustrate the step-by-step details for fabricating a MEMS in accordance with the present invention. As mentioned above, the MEMS in accordance with the present invention may be integrated with a microwave monolithic integrated circuit (NMIC) 53 and formed on a polymer substrate 52 directly thereon. Alternatively, the MEMS may be fabricated as a stand-alone device.

Figure 17A:
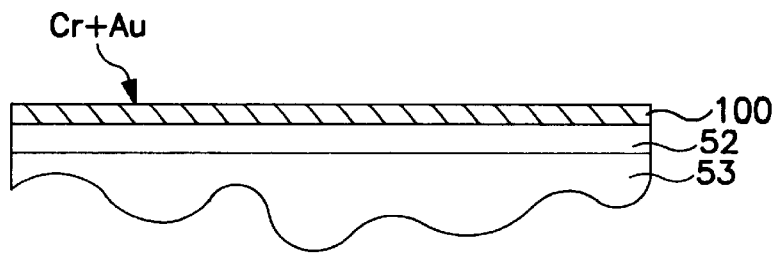
Figure 17B:
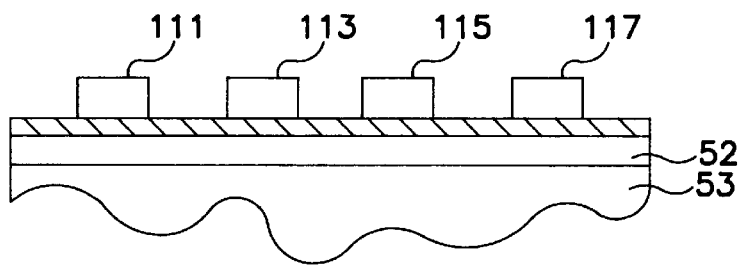
Figure 17C:
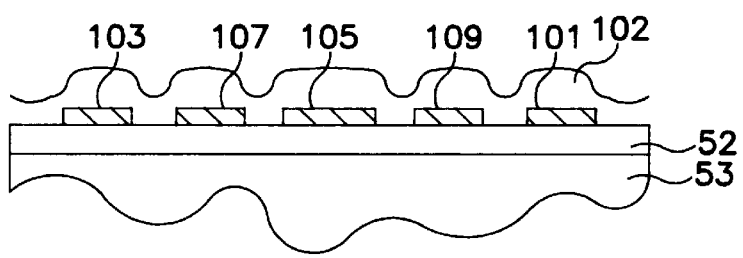

Referring to FIG. 17a, a layer of conductor metal 100 is formed on the substrate layer 52. The conductor metal may be deposited by evaporating, for example, 300 Å chromium (Cr) and 2,000 Å of gold (Au) directly on the substrate 52. The conductor metal layer 100 is masked and patterned by conventional photolithography techniques to form various configurations of contacts and field plates. An exemplary configuration of contacts which includes the contacts 101 and 103, a pivot contact 105, and a pair of field plates 107 and 109 is shown in FIG. 17c. The contacts 101 and 105 as well as the field plates 107 and 109 are electrically coupled to a plurality of input/output ports 111, 113, 115 and 117 (FIG. 17b). The contact 103 is directly coupled to the contact 105. Other configurations are possible.

The photoresist is spun onto the conductor metal layer 100 and exposed by way of the mask to define the contacts, conductors and field plates, for example, as illustrated in FIGS. 8b and 10b. Once the conductor pattern is defined by the photolithic techniques, the conductor metal layer 100 is etched, for example, by wet etching, to form the conductors, contacts and field plates.

Figure 17D:
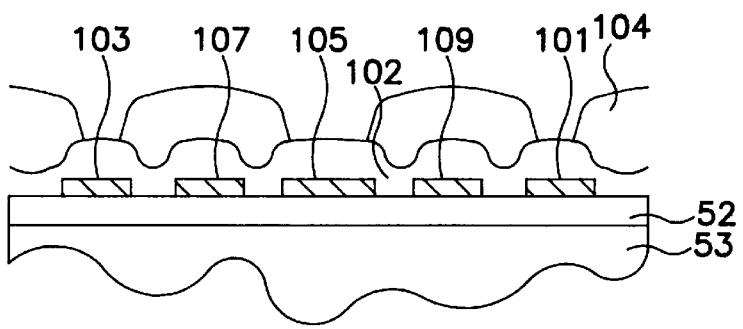
Figure 17E:
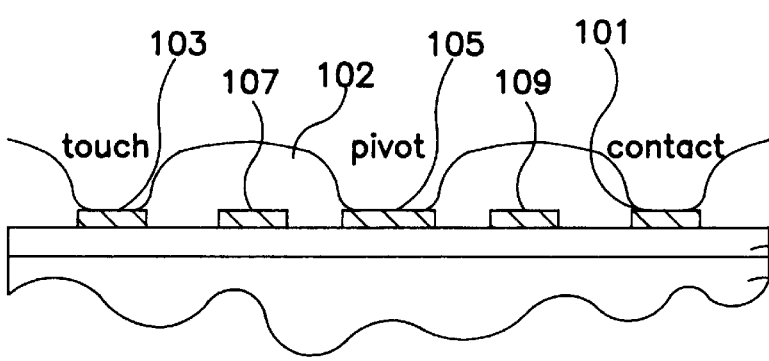

As discussed above, the MEMS is formed in a teeter totter configuration which includes a metal beam, a pivot and one or more pins which are rotatably secured to the substrate with collars. The pivot as well as the collars require the use of a number of spacers. As such, a layer of copper (Cu) 102, for example, 1.2–1.5 μm, is formed on top of the conductors for example, by evaporation as shown in FIG. 17c. The copper layer 102 (identified as copper 1 in FIG. 17c) is used to form the spacer for the pivot as well as the collar, as will be discussed in more detail below. In particular, as illustrated in FIG. 17d, a photoresist layer 104 is spun onto the copper layer 102. The contacts, the pivot, as well as the collar portions are defined by conventional photolithography techniques. After the contacts, collar and pivot are defined, the copper layer 102 is etched, for example, by conventional wet etching, as shown in FIG. 17e. In addition, the photoresist layer 104 is also stripped.

Figure 18A:
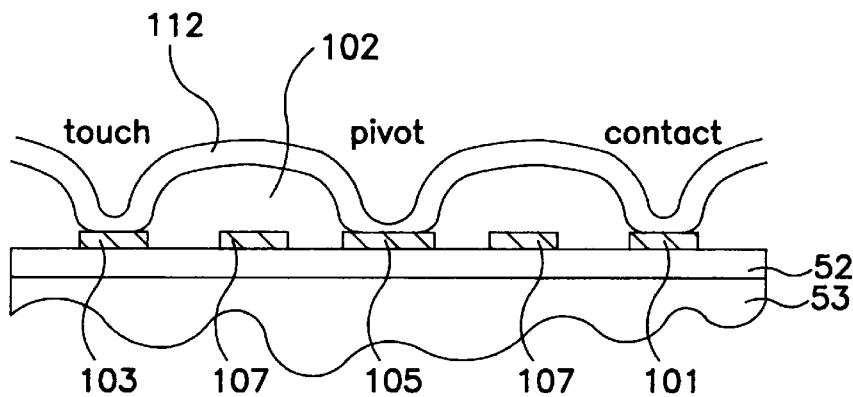
Figure 18B:
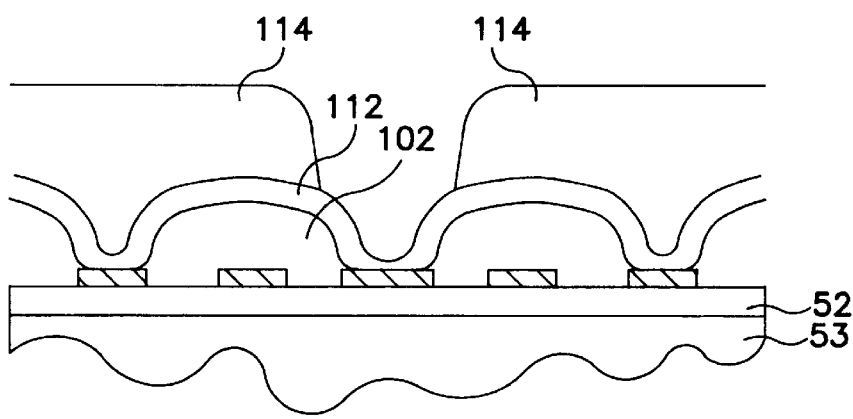
Figure 18C:
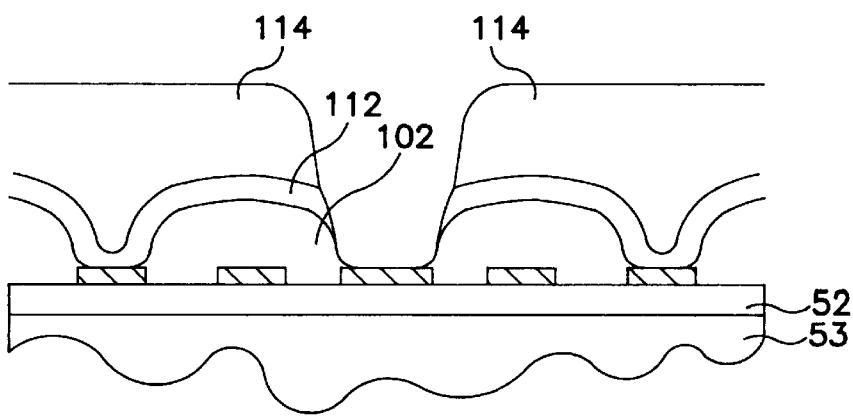

A second spacer is formed as illustrated in FIG. 18a. In particular, a second layer of copper (copper 2) 112, for example 1.2 μm, is formed on top of the structure illustrated in FIG. 17e, for example, by evaporation. Once the second layer of copper 112 is deposited, the pivot and collar base is defined as illustrated in FIGS. 18b and 18c. In particular, a photoresist layer 114 is spun on to the copper layer 112 and exposed by conventional photolithigraphic techniques to define the pivot and collar base as illustrated in FIG. 18b. Subsequently, as illustrated in FIG. 18c, the copper II layer 112 is etched to define the pivot and collar base.

Figure 18D:
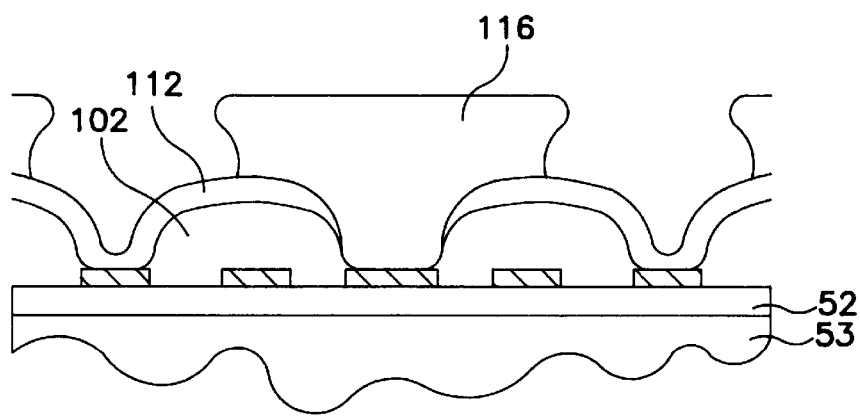
Figure 18E:
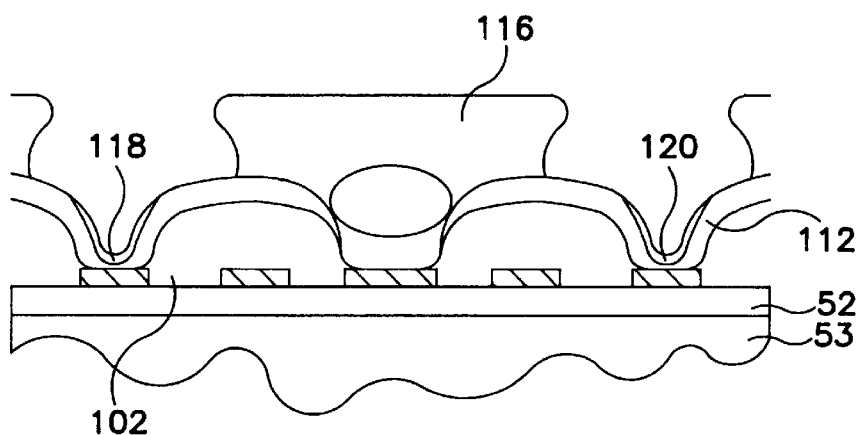

Referring to FIG. 18d, the top contacts are formed as illustrated in FIG. 18d and 18e. In particular, a photoresist layer of, for example, chlorobenzine photoresist 116 is spun onto the structure as illustrated in FIG. 18d. The photoresist layer 116 is masked and exposed by conventional photolithography techniques to define a pair of top gold contacts 118 and 120, as illustrated in FIG. 18e. In particular, once the contact areas are defined as shown in FIG. 18d, 5,000 Å, for example, of gold (Au) is evaporated onto the structure to form the gold contacts 118 and 120.

Figure 18F:
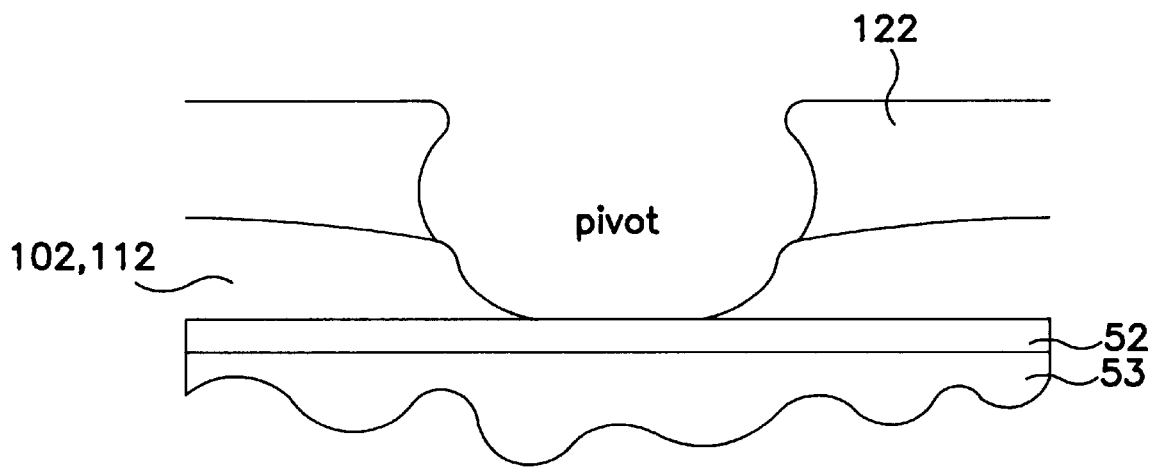
Figure 18G:
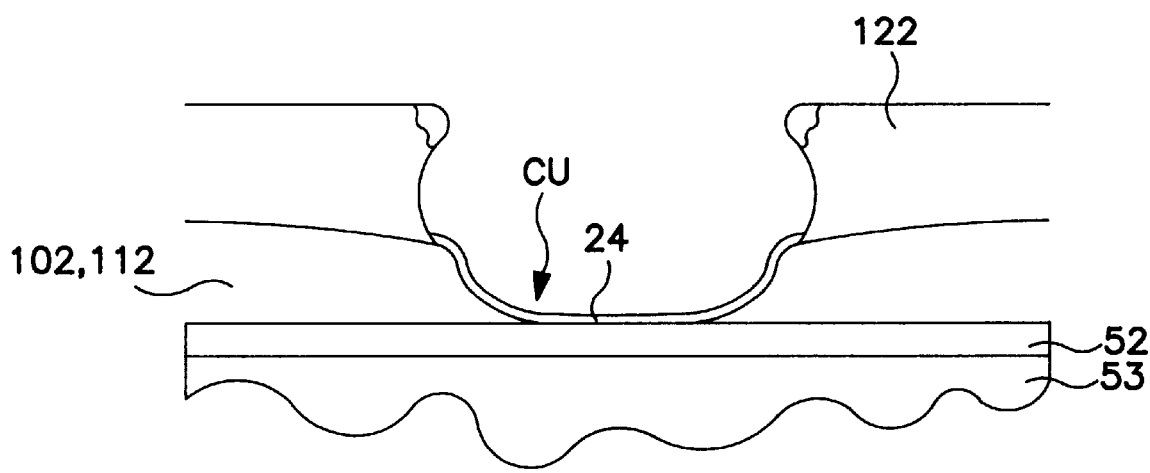

After the gold contacts 118 and 120 are formed, a release copper layer is formed as illustrated in FIGS. 18f and 18 g. In particular, a photoresist layer 122 is spun on to the structure illustrated in FIG. 18e and exposed by conventional photolithography techniques to define a release copper layer 124. The release copper layer 124 is deposited, for example, by evaporating 2,000–5,000 Å of copper on the structure illustrated in FIG. 18f and lifting off the photoresist. The release copper is removed later in the process to allow the pins and pivot formed thereupon to rotate.

Figure 19A:
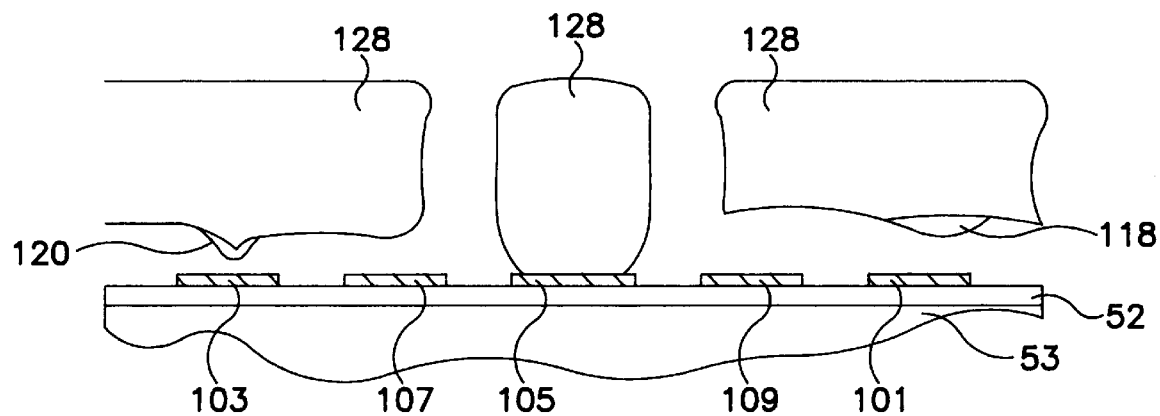

The beam and plates are formed by way of a layer of photoresist (not shown) which is spun onto the structure and patterned by conventional photolithography techniques to define the beam and the field plates. The beam and plates are then formed by plating the structure with, for example, 4 μm of nickel (Ni), forming a first nickel layer (nickel I) 128 (FIG. 19a). Additionally, the photoresist layer mentioned above is stripped.

A cross-section view of the switch after the application of the first nickel layer 128 is illustrated in FIG. 19a. As illustrated in FIG. 19a, the top contacts 118 and 120 are disposed on the underside of the nickel layer 128, which forms the beam. For simplicity, FIG. 19a is shown with the copper layers 102 and 112 removed to illustrate the spacing between the contacts 118 and 120 formed on the under side of the beam and the conductor formed on the substrate 52.

Figure 19B:
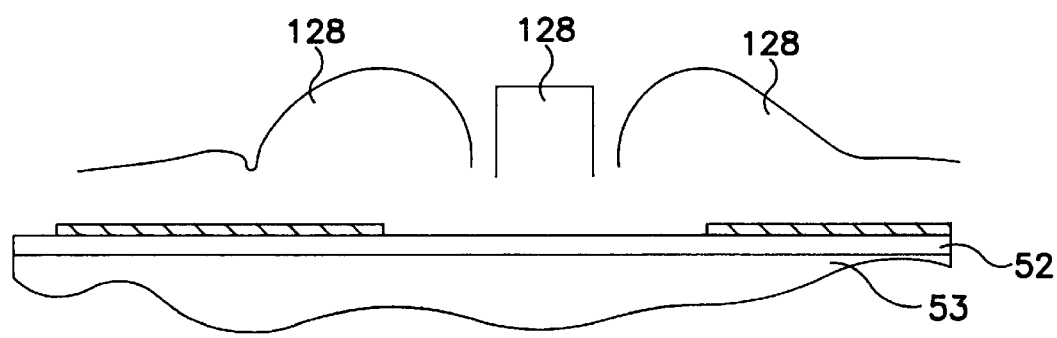
Figure 19C:
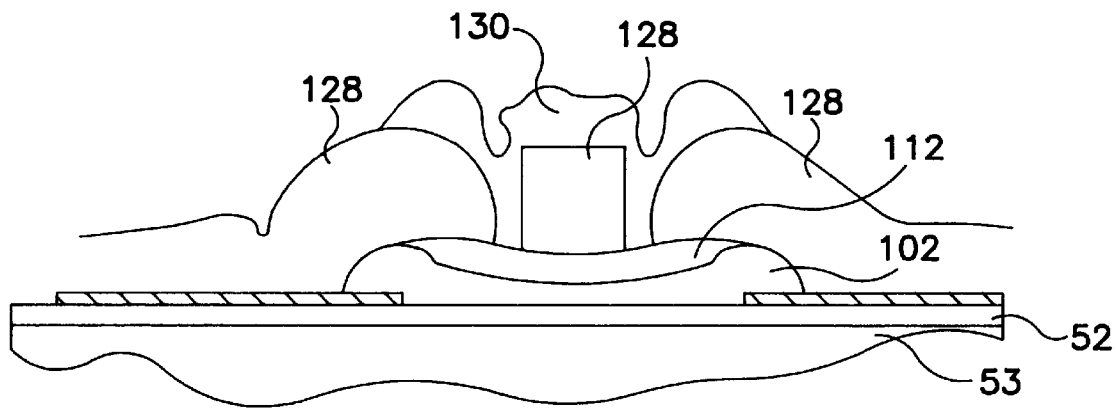
Figure 19D:
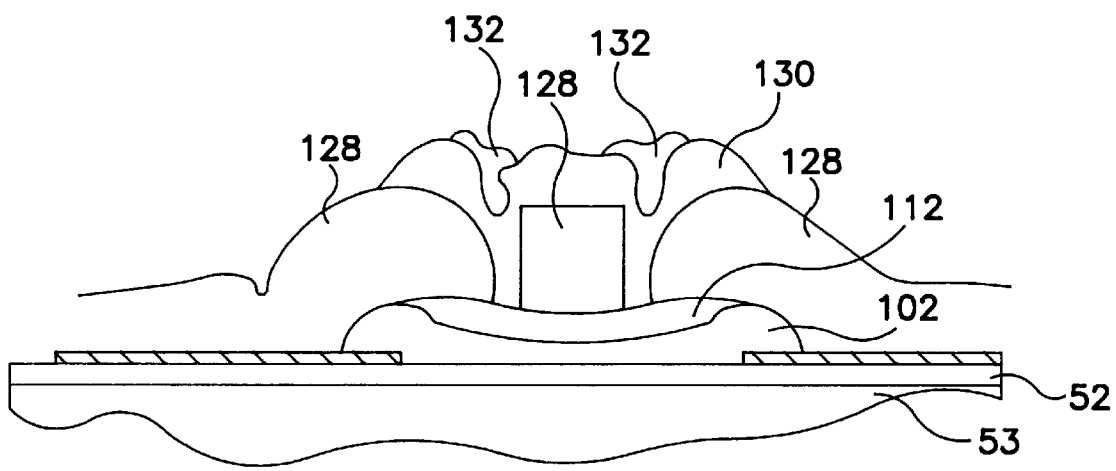

FIG. 19b is a cross-section of a portion of the collar. As shown best in FIG. 20b, a pair of pins 127 and 129 are defined adjacent the pivot. The pins 127 and 129 are formed on top of the copper layer 102.

Two collars 131, 133 (FIG. 20b) are formed on top of the pins 127, 129 by plating layers of copper (copper III and copper IV) 130 and 132 over the pins 127 and 129 (FIGS. 14*c* and 14*d*). The collars 131, 133 may be patterned by conventional photolithography techniques. The first layer may be formed by plating 5,000 mm of copper Cu while the second layer may be formed by plating 2–3 µm of copper Cu from the structure.

Figure 20A:
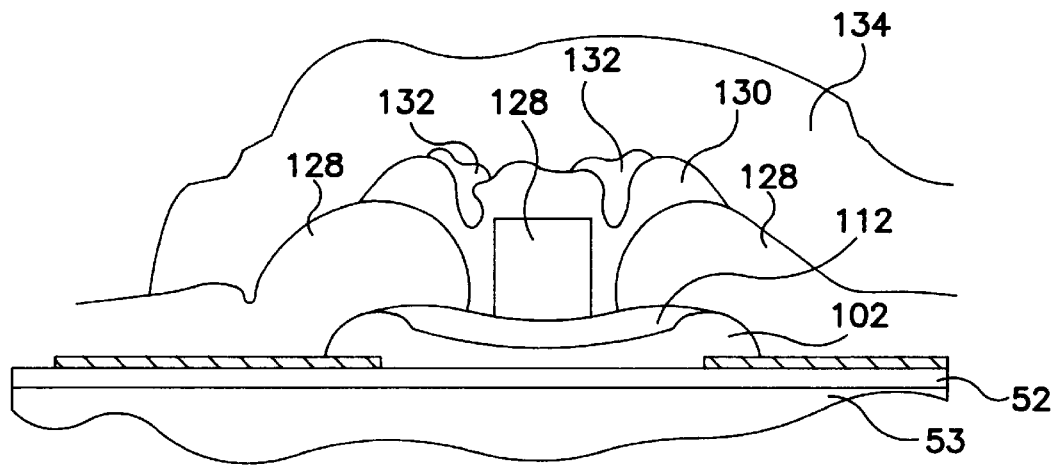
Figure 20B:
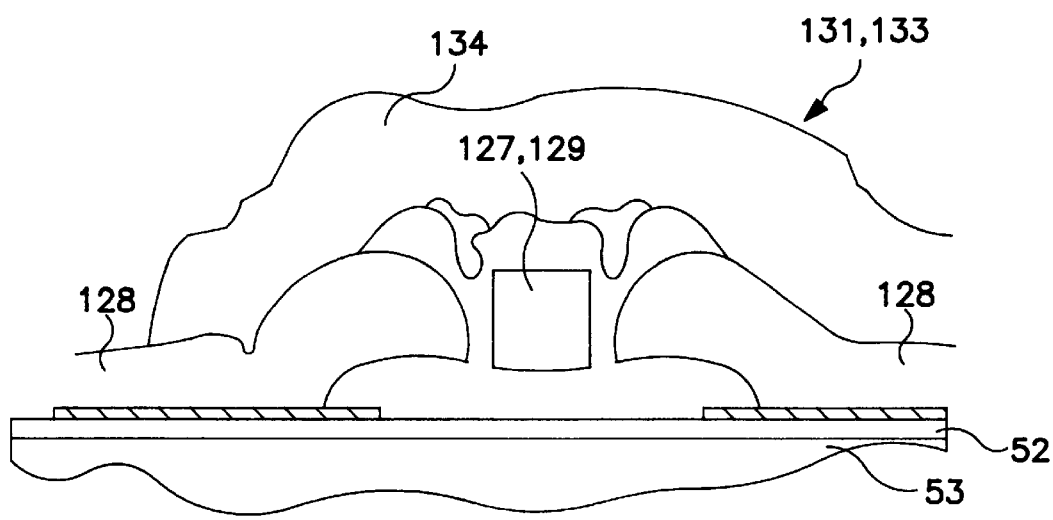
Figure 20C:
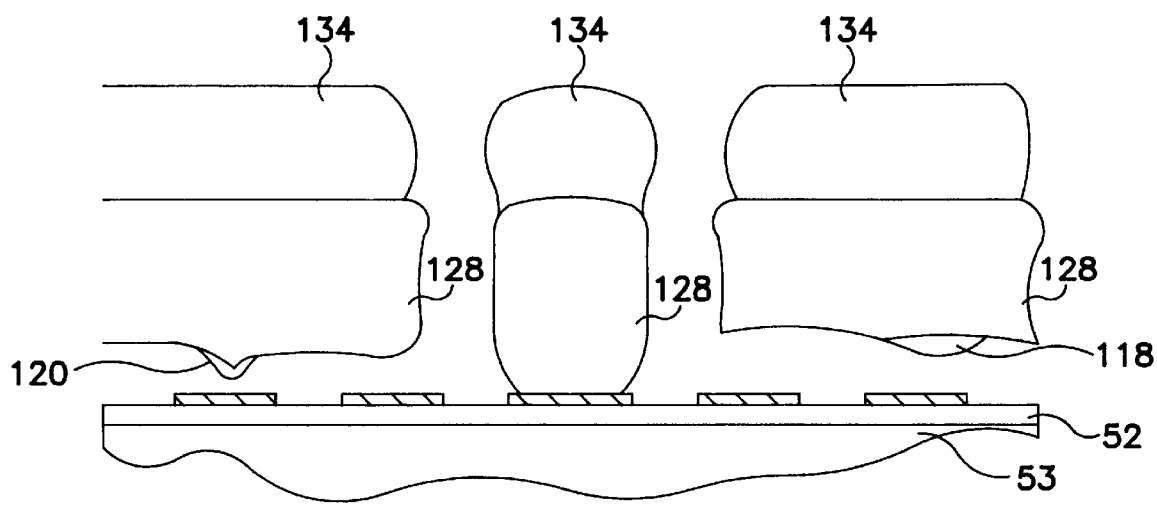

As shown in FIGS. 20*a*–20*c*, a second layer of nickel (nickel II) 134 is formed on top of the structure which reinforces the beam and forms the collars 131, 133 as illustrated in FIG. 19*a* for rotably carrying and capturing the pins 127, 129 with respect to the substrate 52. After the collars 131, 133 are formed over the pins 127 and 129, the copper is etched out to yield the structures illustrated in FIGS. 20*b* and 20*c*. Once the copper is etched out the pins, 127 and 129 are free to rotate as shown in FIG. 20*b*. FIG. 20*c* illustrates the pivot after the copper is etched out.

Obviously, many modifications and variations of the present invention are possible in light of the above teachings. Thus, it is to be understood that, within the scope of the appended claims, the invention may be practiced otherwise than as specifically described above.

We claim:

1. A switchable resonator comprising:
   a plurality of resonant circuits for providing respective plurality of resonant frequencies for tuning the resonant frequencies of a voltage controlled oscillator;
   a voltage controlled oscillator (VCO), whose output frequency relative to a resonant frequency may be controlled by varying the voltage applied to said VCO. said, VCO selectively connectable to each of said plurality of circuits for selecting the resonant frequency of said VCO; and
   a plurality of selectable RF switches for selectively coupling one said plurality of circuits at a time said VCO for electrically tuning the resonant frequency of the switchable resonator.

2. The switchable resonator as recited in claim 1, wherein one or more of said plurality of circuits are formed from a series LC circuit.

3. The switchable resonator as recited in claim 2, wherein said series LC circuit is formed from a capacitor and a predetermined length of microstrip transmission line.

4. The switchable resonator as recited in claim 3 wherein said plurality of resonant frequencies are provided by varying the length of said microstrip transmission line.

5. A frequency synthesizer having a plurality of tunable frequency bands, the frequency synthesizer comprising:
   a resonator having a plurality of selectable resonant circuit outputs for providing respective plurality of resonant frequencies;
   a voltage controlled oscillator (VCO), whose output frequency relative to a resonant frequency may be controlled by varying of voltage applied to said VCO said VCO selectively coupled to said resonator to provide different frequency bands; and
   a plurality of RF switches electrically coupled between said selectable outputs of said resonator and said VCO for electrically tuning the frequency band of the resonator.

6. The frequency synthesizer as recited in claim 5, wherein said resonator is formed from a plurality of series LC circuits.

7. The frequency synthesizer as recited in claim 6, wherein one or more of said series LC circuits is formed from a capacitor and a predetermined length of microstrip transmission line.

8. The frequency synthesizer as recited in claim 7, wherein said plurality of resonant frequencies are provided by varying the length of said microstrip transmission lines.

* * * * *